US012622227B2

(12) United States Patent
Kicin et al.

(10) Patent No.: US 12,622,227 B2
(45) Date of Patent: May 5, 2026

(54) POWER SEMICONDUCTOR MODULE, METHOD FOR MANUFACTURING THE SAME AND ELECTRICAL CONVERTER

(71) Applicant: Hitachi Energy Ltd, Zürich (CH)

(72) Inventors: Slavo Kicin, Zürich (CH); Gernot Riedel, Baden-Rütihof (CH); Jürgen Schuderer, Zürich (CH); Fabian Mohn, Ennetbaden (CH)

(73) Assignee: HITACHI ENERGY LTD, Zürich (CH)

( * ) Notice: Subject to any disclaimer, the term of this patent is extended or adjusted under 35 U.S.C. 154(b) by 346 days.

(21) Appl. No.: 18/268,970

(22) PCT Filed: Dec. 16, 2021

(86) PCT No.: PCT/EP2021/086096
§ 371 (c)(1),
(2) Date: Jun. 21, 2023

(87) PCT Pub. No.: WO2022/136086
PCT Pub. Date: Jun. 30, 2022

(65) Prior Publication Data
US 2024/0079279 A1     Mar. 7, 2024

(30) Foreign Application Priority Data

Dec. 22, 2020     (EP) .................................... 20216589

(51) Int. Cl.
*H01L 21/66*          (2006.01)
*H01L 23/495*        (2006.01)
(Continued)

(52) U.S. Cl.
CPC ........ *H01L 22/22* (2013.01); *H01L 23/49562* (2013.01); *H01L 23/49575* (2013.01); *H01L 23/5382* (2013.01); *H01L 25/072* (2013.01)

(58) Field of Classification Search
None
See application file for complete search history.

(56) References Cited

U.S. PATENT DOCUMENTS 6,395,566 B2 * 5/2002 Farnworth .............. H01L 22/22
                                                                      438/18
6,803,664 B2   10/2004 Murayama
(Continued)

FOREIGN PATENT DOCUMENTS

DE     202016101991 U1     5/2016
EP           2908339 A1     8/2015
(Continued)

*Primary Examiner* — Sue A Purvis
*Assistant Examiner* — Jordan M Klein
(74) *Attorney, Agent, or Firm* — PROCOPIO, CORY, HARGREAVES & SAVITCH LLP

(57)     ABSTRACT

A power semiconductor module (34), comprising a substrate (12) which carries a plurality of power semiconductor devices (10), wherein the plurality of power semiconductor devices (10) comprises a first group of power semiconductor devices (10) and a second group of at least one power semiconductor device (10). The first group of power semiconductor devices (10) consists of at least two non-damaged power semiconductor devices (10b, 10c), and the second group of power semiconductor devices (10) consists of at least one damaged power semiconductor device (10a). The at least two non-damaged power semiconductor devices (10b, 10c) are electrically interconnected in a parallel configuration, and the second group of at least one power semiconductor device (10) is electrically separated from the members of the first group of power semiconductor devices (10).

The disclosure further relates to an electrical converter and a method for manufacturing a power semiconductor module (34).

9 Claims, 3 Drawing Sheets

(51) Int. Cl.
    *H01L 23/538*      (2006.01)
    *H01L 25/07*       (2006.01)

(56)           References Cited

U.S. PATENT DOCUMENTS

| | | | |
|---|---|---|---|
| 8,791,508 B2 | 7/2014 | Roberts et al. | |
| 10,067,175 B2 | 9/2018 | Ramirez et al. | |
| 2010/0252922 A1* | 10/2010 | Bayerer | H01L 25/072 |
| | | | 156/60 |
| 2013/0126866 A1* | 5/2013 | Hatsukawa | H01L 22/22 |
| | | | 257/E21.526 |
| 2016/0261180 A1 | 9/2016 | Brueckner et al. | |
| 2016/0343590 A1* | 11/2016 | Yoshihara | H01L 23/49582 |

FOREIGN PATENT DOCUMENTS

| | | | |
|---|---|---|---|
| JP | 2020-518226 A | 6/2020 | |
| WO | 0021135 A1 | 4/2000 | |

\* cited by examiner

POWER SEMICONDUCTOR MODULE, METHOD FOR MANUFACTURING THE SAME AND ELECTRICAL CONVERTER

CROSS-REFERENCE TO RELATED APPLICATIONS

This application is US National Stage of International Patent Application PCT/EP2021/086096, filed Dec. 16, 2021, which claims priority to European Patent Application No. 20216589.0, filed on Dec. 22, 2020, the contents of which is incorporated herein by reference.

TECHNICAL FIELD

The present disclosure relates to an improved method for manufacturing a power semiconductor module showing an improved manufacturing process. The present disclosure further relates to an improved power semiconductor module and electrical converter.

BACKGROUND ART

Power semiconductor modules are generally widely known in the art. Such power semiconductor modules, for example industrial insulated-gate bipolar transistor (IGBT) modules, comprise a plurality of power semiconductor devices also called chips. Silicon based power devices, such as IGBTs, for example, can be manufactured with high current rating per chip. Wide band gap devices such as silicon carbide metal-oxide-semiconductor field-effect transistors (SiC MOSFETs) or gallium nitride high-electron-mobility transistors (GaN HEMTs), however, have typically low current rating per chip to counteract yield issues coming from semiconductor material and from processing. Consequently, many small devices are often paralleled to achieve competitive (targeted) current rating.

However, such a configuration leads to the risk of losing an entire package with all chips if one chip gets damaged during the embedding process. Accordingly, high requirements for the manufacturing process of power semiconductor modules are needed in order to avoid chip losses due to damages. Further, high production costs may arise in case chips are lost despite all requirements.

The prior art thus gives room for improvements with this regard. Exemplarily, there is the need for a solution which improves the manufacturing of power semiconductor modules with regard to losing chips due to damages during the manufacturing process of the power semiconductor module.

SUMMARY OF INVENTION

Embodiments of the disclosure address the above shortcomings in the art in whole or in part, as further explained below. These are addressed at least in part by providing a solution allowing an improved process of manufacturing a power semiconductor module and providing an improved power semiconductor module and electrical converter, which solve or reduce the above mentioned problems.

The above-mentioned object is solved at least in part by a power semiconductor module having the features of independent claim 1. The object is further at least in part solved by an electrical converter having the exemplary features and by a method for manufacturing a power semiconductor module having the exemplary features. Further embodiments are given in the dependent claims, in the further description as well as in the figures, wherein the described embodiments can, alone or in any combination of the respective embodiments, provide a feature of the present disclosure unless clearly excluded.

According to a first aspect, a method for manufacturing a power semiconductor module, wherein the power semiconductor module comprises a plurality of power semiconductor devices, said method comprising:

a) providing at least one substrate for carrying the plurality of power semiconductor devices; and b) placing the plurality of power semiconductor devices on the at least one substrate;

wherein the method further comprises manufacturing steps as follows:

c) measuring, if one or more power semiconductor devices of the plurality of power semiconductor devices are damaged;

d) electrically interconnecting at least a part of the power semiconductor devices comprising at least two power semiconductor devices in a parallel configuration;

wherein after realizing the steps c) and d) and in case of one or more power semiconductor devices being a damaged power semiconductor device, electrically separating the one or more damaged power semiconductor devices from the non-damaged power semiconductor devices; and wherein after realizing the steps c) and d) at least two of the electrically interconnected power semiconductor devices in the parallel configuration are non-damaged power semiconductor devices.

An advantage of this method is that it provides a solution which allows reducing the danger of losing an entire power semiconductor module despite having damaged chips. Such a method significantly reduces, for example, the danger of module losses and of losing a huge amount of non-damaged chips. Thus, this method significantly improves manufacturing of power semiconductor modules.

The method as described is suited for manufacturing a power semiconductor module, wherein the power semiconductor module comprises a plurality of power semiconductor devices. The power semiconductor devices which are part of the power semiconductor module to be formed may generally be electrically interconnected in a parallel configuration. Those parallelly connected devices are, for example, part of a half-bridge configuration of SiC devices. In said half-bridge configuration, two groups of semiconductor devices are connected in series, wherein devices within each of those groups are connected in parallel. Such half-bridge configuration has the advantage that it reduces a stray inductance of a respective module compared to the same configuration formed by two separate power modules having configuration of a single switch.

With this regard, wide bandgap devices such as SiC MOSFETs or GaN HEMTs are getting in the market more and more. One major reason for this is the superior switching performance compared to today's silicon power devices. Those wide band gap devise switch much faster, which reduces switching losses. The high switching speed poses challenges, such as low inductance, on the electromagnetic design of the power module that contains the chips and that connects them with the power electronic system, such as a converter.

On the other hand, wide band gap power devices are much smaller and can carry significantly less current per chip compared to silicon devices. Therefore, to achieve high power, many chips, such as up to 40 for example, or even more, are connected in parallel inside the power module. An electromagnetic design may be advantageous, in which all chips see the same gate signals and have the same electromagnetic coupling so that they all share the current equally during switching and during conduction. Furthermore, it may be advantageous for all chips to be well cooled. However, for example in order to reach such requirements of the module, it should be avoided that, during a manufacturing process, a large number of power semiconductor devices is lost due to the damage of single or a small amount of power semiconductor devices.

These requirements may be addressed by the above-mentioned method according to the present disclosure.

The substrate, which is provided in step a), may generally be chosen according to specific requirements and may generally act as a support for positioning the power semiconductor devices. Such a substrate may, for example, be a ceramic substrate which carries the power semiconductor devices by means of a respective metallization, or the substrate may be a metallic substrate, such as a leadframe, for example. However, those examples are not limiting the present disclosure.

With regard to the power semiconductor devices, mentioned in the method according to the first aspect, these may be chosen according to desired needs and characteristics of a formed power semiconductor module. However, in order to achieve targeted current rating, it may be advantageous to connect semiconductor devices in parallel.

Further, placing the power semiconductor devices on the substrate may generally be done according to the prior art, e.g. directly or by providing respective connecting layers, such as metallization layers, on the substrate.

After having placed the power semiconductor devices on the substrate, it is measured, if one or more power semiconductor devices are damaged. A state in which the power semiconductor device is damaged is generally any state in which it does not work properly but deviates from pre-defined characteristics. Accordingly, a non-damaged power semiconductor device is any device which works properly and thus within pre-defined characteristics. For example, defective chips may show a gate emitter short, high gate current leakage or not sufficient voltage blocking capacity.

This measuring step may generally be done by determining parameters of the power semiconductor device and comparing said parameters with a pre-defined characteristic and thus with corresponding predefined and expected parameters. In case all power semiconductor devices are determined to work properly, the interconnections may remain unchanged, in case the power semiconductor devices were interconnected before the measuring step. In case the power semiconductor devices have not been interconnected before measuring, they may all be interconnected in this case, after the measuring determined that all of them work properly.

Subsequently, at least a part of the power semiconductor devices of the power semiconductor module are electrically interconnected. At least two non-damaged power semiconductor devices are interconnected in a parallel manner. Thereby, it may be ensured that not a whole module and thus a huge amount of power semiconductors devices is lost due to damage of one or several semiconductor devices.

The step of electrically interconnecting the power semiconductor devices may generally be performed as it is known in the art from the field of manufacturing of power semiconductor modules. For example, this step may be performed by connecting the power semiconductor devices by electrical conductors, which power semiconductor devices had been placed on respective positions of electrically conducting structures, such as on respective metallizations.

Moreover, in case at least one damaged power semiconductor device is determined in the measuring step, the method comprises the step of electrically separating the at least one damaged power semiconductor device from the non-damaged power semiconductor devices. In more detail, all power semiconductor devices which are determined to be damaged are electrically separated and thus at least partially electrically disconnected from the remaining and thus non-damaged power semiconductor devices. This can be done by removing the electrical connections between already interconnected power semiconductor devices or by not interconnecting the damaged power semiconductor devices in the interconnecting step.

This step thus allows removing the damaged chip(s) from the commutation loop, or commutation cell, respectively.

According to one embodiment of the first aspect, step d) is realized before step c) for a part of the power semiconductor devices and step c) is realized before step d) for another part of the power semiconductor devices. In another embodiment of the first aspect, step d) is realized before step c) for all power semiconductor devices. In yet another embodiment of the first aspect, step c) is realized before step d) for all power semiconductor devices. According to those embodiments, the chips, which are already interconnected in a parallel manner, are measured, or the chips are measured in a state in which these are not yet electrically interconnected with the further power semiconductor devices, or a combination thereof.

Accordingly, the method comprises the step of interconnecting at least a part, or all, of the non-damaged power semiconductor devices in a parallel configuration, thereby leaving the damaged power semiconductor devices electrically insulated therefrom. In more detail, it may exemplarily be provided that all chips which are detected to be non-damaged are interconnected in a parallel configuration but in case that chips are detected to be damaged, such chips are not interconnected with the non-damaged chips. In other words, only non-damaged chips are interconnected and damaged chips are left out of the commutation loop. Thereby, the interconnecting of the chips may be performed in a chip specific manner.

Electrically separating power semiconductor devices in this context means leaving them out of the commutation loop such that they do not interfere with the performance of the module. In that regard, not all electrical connections between a damaged and a non-damaged power semiconductor module need to be removed. It is possible, for example, to disconnect electrical connections to an emitter and a gate of a damaged power semiconductor module, but leave other contacts connected.

Thus, to summarize, the present method is based on the general steps of measuring individual chips, identifying damaged chips, or broken ones, respectively, and electrically separating the damaged chips from the non-damaged ones in order to get an arrangement in which essentially only non-damaged chips are electrically interconnected in parallel.

According to one embodiment, steps c) and d) or steps d) and c) are subsequently performed in turns multiple times, each time for at least one power semiconductor device of the plurality of power semiconductor devices. In a possible configuration of that embodiment, initially, a first contact, for example a gate contact, of a first power semiconductor device is electrically interconnected to already interconnected power semiconductor devices or to other circuitry of a respective power semiconductor module and, subsequently, it is measured, whether said first power semiconductor device is damaged. In case it is determined that the first power semiconductor device is damaged, the first power semiconductor device is disconnected and those steps are repeated with at least one further power semiconductor device. In case it is determined that the first power semiconductor device is not damaged, the first power semiconductor device stays connected and those steps are repeated with at least one further power semiconductor device.

This stepwise measuring and interconnecting of non-damaged power semiconductor devices is in particular advantageous for conventional power modules, wherein wire bonding is used to electrically interconnect the power semiconductor devices. The wire bond connection of a gate of such power semiconductor device may pose a main risk. For such a module, according to the above-mentioned embodiment, a first gate may be connected via a wire bond. After connecting the first gate, a source-gate connection of said device is measured. In case it is determined that the device is damaged, e.g. in that a short is discovered while the source-gate connection is measured, the respective device is disconnected and the same procedure is repeated with a next power semiconductor device. In case the measured device is found to be functional, said device stays connected and the same procedure is repeated with a next power semiconductor device.

According to one embodiment, for such power semiconductor devices, for which step d) is realized before step c), and in case of one or more power semiconductor devices being a damaged power semiconductor device, the one or more damaged power semiconductor devices are electrically separated from the non-damaged power semiconductor devices by interrupting an electrical connection to the one or more damaged power semiconductor device. Thereby, even after interconnecting the power semiconductor devices, defective power semiconductor devices may still be electrically separated from non-defective ones. This way, the above-mentioned object is achieved.

Generally, the above method has significant advantages over methods for manufacturing power semiconductor modules according to the prior art.

In fact, it may be achieved that those chips that are damaged are not connected to the remaining chips so that the non-damaged chips may operate undisturbed. This increases the overall yield and thus reduces the costs of fabricating for example high current modules.

Further advantages comprise inter alia allowing a higher level of integration which is possible due to lower risk of losing the entire system because of one or few broken chips. In fact, a plurality of chips may sit on the same substrate, such as a leadframe, for example. According to the prior art, it is often provided that a plurality of chips is positioned on one leadframe each for yield reasons, which however may securely be avoided according to the present disclosure. The present disclosure may thus allow an increased power density, improved cooling, and a higher design flexibility.

With regard to high design flexibility, it may be noted that the present disclosure may well be applicable also for vertical devices which are electrically connected on the bottom. For example, an IGBT has the collector at the bottom and gate and emitter on top. For electrically separating a broken IGBT it is sufficient to disconnect the top contacts, i.e. gate and emitter.

However, the present disclosure may also work for standard power modules. Here, the disconnecting of paralleled devices can be done by removing bond wires or not placing them in the first place.

Thus, the present disclosure is applicable to a broad range of module arrangements.

The present disclosure may use the so-called PCB-technology. With this regard and as generally known in the art, a printed circuit board (PCB) mechanically supports and electrically connects electrical or electronic components using conductive tracks, pads and other features etched from one or more sheet layers of copper laminated onto and/or between sheet layers of a non-conductive substrate. By using this technology, the disclosure may be performed very effectively. Further, this method can be implemented in a power module, exemplarily with PCB embedded parallel chips without problems.

In detail, PCB embedding is a promising technology for designing power modules with many parallel chips due to the good electromagnetic design flexibility in multilevel PCBs. However, the yield issue is now shifted towards the packaging. According to the presented method, this limitation is overcome due to the advantages as described, e.g. if one chip is damaged during the process, it is separated from the rest and the power module can be used with some minor derating.

All those electromagnetic challenges can be well addressed when using PCB-embedding as a packaging technology. Here, all the signal and power traces can be well routed in a multi-layer PCB to design the electromagnetic behavior as desired. The thermal challenges are also well addressed due to superior heat spreading in PCB embedded assemblies, which is again very important for small wide band gap chips. Furthermore, an entire converter can be built on one PCB with embedded semiconductors which makes it very compact.

A drawback of wide band gap devices is their high cost. Therefore, having a high yield in every single process step is suitable to avoid costly waste. When embedding many chips in one PCB, the probability that one chip is broken during the processing is small, but not negligible. In case one chip is broken, all chips such as up to 40 or even up to 100, for example, inside the PCB as well as the PCB itself cannot be used anymore. To avoid this, this disclosure proposes a possibility to electrically separate the broken chip and to save the rest which can operate with derated performance. The more chips in parallel are used, the more likely one failure gets and the less the performance derating will be. Therefore, the disclosure is even more advantageous for many chips in parallel.

According to one embodiment, the electrical connection is interrupted by drilling, cutting or stamping. According to this embodiment and thus by providing that electrically separating the damaged power semiconductor devices from the non-damaged power semiconductor devices is performed by drilling, cutting or stamping, a very secure measure may be reached in which it may be ensured very effectively, that damaged power semiconductor devices are electrically separated from the non-damaged ones. Therefore, the above described advantages may be reached in a very efficient manner.

Apart from that, such methods may be implemented in known manufacturing processes easily, so that this embodiment further helps to implement the present disclosure also into known manufacturing processes.

According to one embodiment, in step c), at least one measuring point is provided on at least one of the power semiconductor devices for measuring at least one of an electric, magnetic or temperature parameter in order to detect damaged power semiconductor devices. This embodiment also allows to easily implement the present disclosure into known manufacturing processes. This may be mainly due to the fact that measuring the power semiconductor devices is a process step which may be realized without the provision of a complex periphery. Apart from that, by measuring the power semiconductor devices and thus by examining the electronic, magnetic or temperature properties thereof, very trustful results may be achieved which allow very precisely determining damaged chips. Thus, this embodiment further helps to reach the advantages as described before in an effective manner.

According to one embodiment, the at least one measuring point is formed as a spot accessible from outside for interrupting the electrical connection. Therefore, the module may comprise respective holes or recesses which allow to contact the measuring contacts.

In general, measuring electronic properties is a very effective measure in order to determine if power semiconductor devices are broken or not.

Measuring points may further be formed by predetermined breaking points, such as by metallization bridges which form a respective predetermined breaking point and which are accessible for electrical measurements. With this regard, the breaking points may be provided in locations that correspond or at least mainly correspond to according contacts in existing power semiconductor modules, such that the same positions may be used for measuring the power semiconductor devices and thus to find damaged power semiconductor devices and further for electrically insulating the damaged power semiconductor devices from the non-damaged ones without extensive design changes on the power semiconductor module itself.

With regard to the above, predetermined breaking points are exemplary positions of the electric structure and thus e.g. of the metallizations, which may have reduced thickness and/or reduces widths, for example. Thus, disconnecting the power semiconductor device in this position and thus electrically separating the damaged power semiconductor device from the non-damaged one can be done with improved security and reliability.

Further, dependent from the number of chips which are separated from the remaining chips, adapted characteristics may be provided in order to provide correct specifications of the power semiconductor module.

In conclusion, this disclosure allows the fabrication of power modules with many parallel chips with an improved manufacturing method.

With regard to further advantages and technical features of the method, it is referred to the power semiconductor module, the converter, the figures and the further description.

According to a second aspect of the disclosure, a power semiconductor module comprises a substrate which carries a plurality of power semiconductor devices, wherein the plurality of power semiconductor devices comprises a first group of power semiconductor devices, which first group of power semiconductor devices consists of non-damaged power semiconductor devices, and a second group of power semiconductor devices, which consists of damaged power semiconductor devices. At least two non-damaged power semiconductor devices are electrically interconnected in a parallel configuration and the second group of power semiconductor devices is electrically separated from the members of the first group of power semiconductor devices.

Such a power semiconductor module thus comprises a first group of power semiconductor devices which are non-damaged and thus work in a pre-defined manner and the power semiconductor module further comprises a second group of power semiconductor devices which are damaged. The first group comprises at least two power semiconductor devices. For example, the first group of power semiconductor devices may comprise up to 40 devices, or more.

Due to the fact that the damaged power semiconductor devices are electrically separated from the non-damaged ones, the non-damages power semiconductor devices work without being negatively influenced by the damaged power semiconductor devices.

This may lead to the advantages as described in greater detail with regard to the method, which also apply with regard to the power semiconductor module.

The first group of power semiconductor devices may comprise at least one power semiconductor device which is provided with a measuring arrangement, wherein the measuring arrangement comprises at least one measuring point for measuring at least one of electronic, magnetic and temperature properties of the at least one power semiconductor device. According to one embodiment, the at least one measuring point may be formed by a pre-determined breaking point.

For example, all provided power semiconductor devices may be provided with a respective measurement arrangement. Alternatively, it may also be possible to provide only one or some measuring points to measure the characteristics of multiple power semiconductor modules, and calculate, from the measuring results, which power semiconductor modules are defective and electrically separate those.

According to this embodiment, like described with regard to the method, the power semiconductor modules may be arranged corresponding or mainly corresponding to prior art power modules in order to provide an effective and easy to implement adaptation of this disclosure to existing processes. With this regard, already existing connections may be used for measuring the power semiconductor devices and thus to find damaged power semiconductor devices and further for electrically separating the damaged power semiconductor devices from the non-damaged ones.

With regard to further advantages and technical features of the power semiconductor module, it is referred to the method, the converter, the figures and the further description.

According to a third aspect of the disclosure, an electrical converter comprises at least one power semiconductor module according to the second aspect.

Due to the fact that such an inverter comprises at least one power semiconductor module as described above with respect to the second aspect, significant advantages such as described with regard to the second aspect may be reached.

Further advantages are described in detail with regard to the method and also apply for the converter.

Features which are disclosed with regard to either of the first, the second or the third aspect, may correspondingly be applied to any of the other aspects as well.

With regard to further advantages and technical features of the converter, it is referred to the power semiconductor module, the method, the figures and the further description.

BRIEF DESCRIPTION OF DRAWINGS

These and other aspects of the disclosure will be apparent from and elucidated with reference to the embodiments described hereinafter. Individual features disclosed in the embodiments can constitute alone or in combination an aspect of the present disclosure. Features of the different embodiments can be applied from one embodiment to another embodiment.

In the drawings.

DESCRIPTION OF EMBODIMENTS

Figure 1:
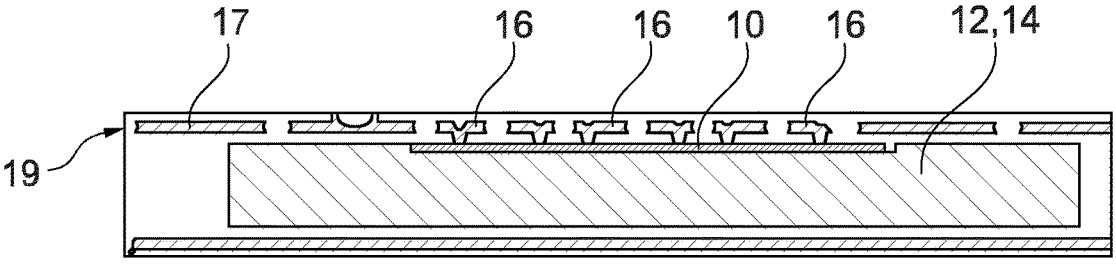
FIG. 1 shows a schematic cross sectional side view of a part of a power semiconductor module with a power semiconductor device according to one embodiment of the disclosure.
Figure 2:
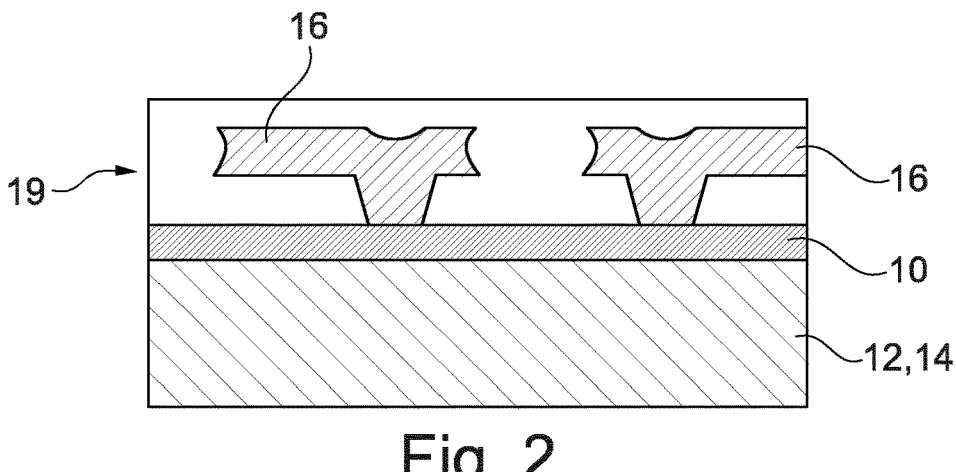
FIG. 2 shows an enlarged view of the power semiconductor device according to FIG. 1.

FIGS. 1 and 2 show a cross sectional side view of a part of a power semiconductor module with a power semiconductor device 10 which is positioned on a substrate 12, which, in this case, is formed as a leadframe 14, wherein FIG. 2 shows a detail of FIG. 1. In more detail, the power semiconductor device 10 as shown in FIGS. 1 and 2 is a PCB embedded GaN chip. The leadframe 14 has an advantage in that an improved thermal performance compared to other substrates 12 may be reached and thus the power semiconductor device 10 may be cooled more efficiently. However, in other embodiments, different substrates 12 may be used.

Further shown are electrical connections in the form of vias 16. These electrical connections may be used for connecting respective terminals, such as gate, source, and drain terminals, for example. Thus, the vias 16 extend from the power semiconductor device 10 to PCB layers 19 of the power module and provide an electrical connection to a copper layer 17.

The power semiconductor module, of which a part is shown in FIGS. 1 and 2, is manufactured or further processed by a method for manufacturing a power semiconductor module according to the present disclosure, as it is described in this application. In particular, it is measured, whether the power semiconductor device 10 is damaged. The power semiconductor module, of which a part is shown in FIGS. 1 and 2, additionally comprises further similar power semiconductor devices, not shown herein, which are also measured in that regard. Those power semiconductor devices, which are determined to be defective, are then neglected from interconnecting the power semiconductor devices with the rest of the power semiconductor module or, in case defective power semiconductor devices are already interconnected, the interconnections of those defective power semiconductor devices are dismantled.

Ultimately, the power semiconductor module comprises non-damaged power semiconductor devices, such as the power semiconductor device 10 shown in FIGS. 1 and 2, which are interconnected in a parallel configuration. In case damaged power semiconductor devices were determined, they are electrically separated from the non-damaged power semiconductor devices.

Figure 3:
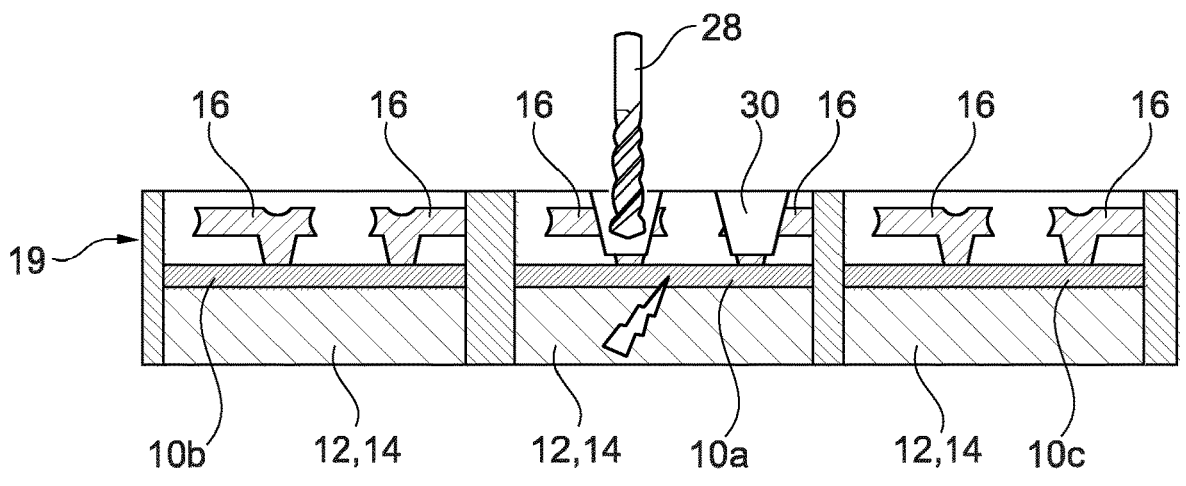
FIG. 3 shows a schematic view of a part of a power semiconductor module, according to one embodiment of the disclosure, during a step of a method for manufacturing the power semiconductor module according to one embodiment of the disclosure.

FIG. 3 shows a schematic view of three parts of a power semiconductor module according to one embodiment of the disclosure during a step of a method for manufacturing a power semiconductor module. The power semiconductor module shown in FIG. 3 corresponds in general to the power semiconductor module as described with reference to FIGS. 1 and 2. Details of the power semiconductor module, which were already described with regard to FIGS. 1 and 2, are not repeated herein.

In FIG. 3, three power semiconductor devices 10*a*, 10*b*, 10*c* are shown, which each may correspond in general to the power semiconductor device 10 as described with reference to FIGS. 1 and 2. A substrate 12 is provided for carrying the plurality of power semiconductor devices 10*a*, 10*b*, 10*c*. The plurality of power semiconductor devices 10*a*, 10*b*, 10*c* are placed on the substrate 12. The power semiconductor devices 10*a*, 10*b*, 10*c* are interconnected in a parallel configuration.

According to the embodiment as shown in FIG. 3, it has been determined that the middle power semiconductor device 10*a* is damaged and the outer power semiconductor devices 10*b* and 10*c* are not damaged but work properly. In order to avoid losing a plurality of power semiconductor devices 10 in case one or few of the power semiconductor devices 10 of the power semiconductor module are damaged and thus in the example of FIG. 3, in order to avoid losing power semiconductor devices 10*b* and 10*c* due to the damage of power semiconductor device 10*a*, the damaged power semiconductor device 10*a* is electrically separated from the non-damaged power semiconductor devices 10*b*, 10*c*.

According to the embodiment as shown in FIG. 3, the separation of the damaged power semiconductor device 10*a* is performed by drilling so-called "via holes" 30 and thus by destroying the respective vias 16 by using a drill 28. Drilling may generally be performed mechanically or by laser drilling. As a general measure, the remaining via holes 30 could subsequently be filled with epoxy or other material, for example when further PCB layers are laminated to the top, or can be left open.

This leads to a secure and reliable electric separation of the damaged power semiconductor device 10*a* from the non-damaged power semiconductor devices 10*b*, 10*c*.

The remaining interconnected non-damaged power semiconductor devices 10*b*, 10*c* then are part of a power semiconductor module, which can still be used with some minor derating, despite physically comprising a damaged power semiconductor device 10*a*.

Figures 4, 5:
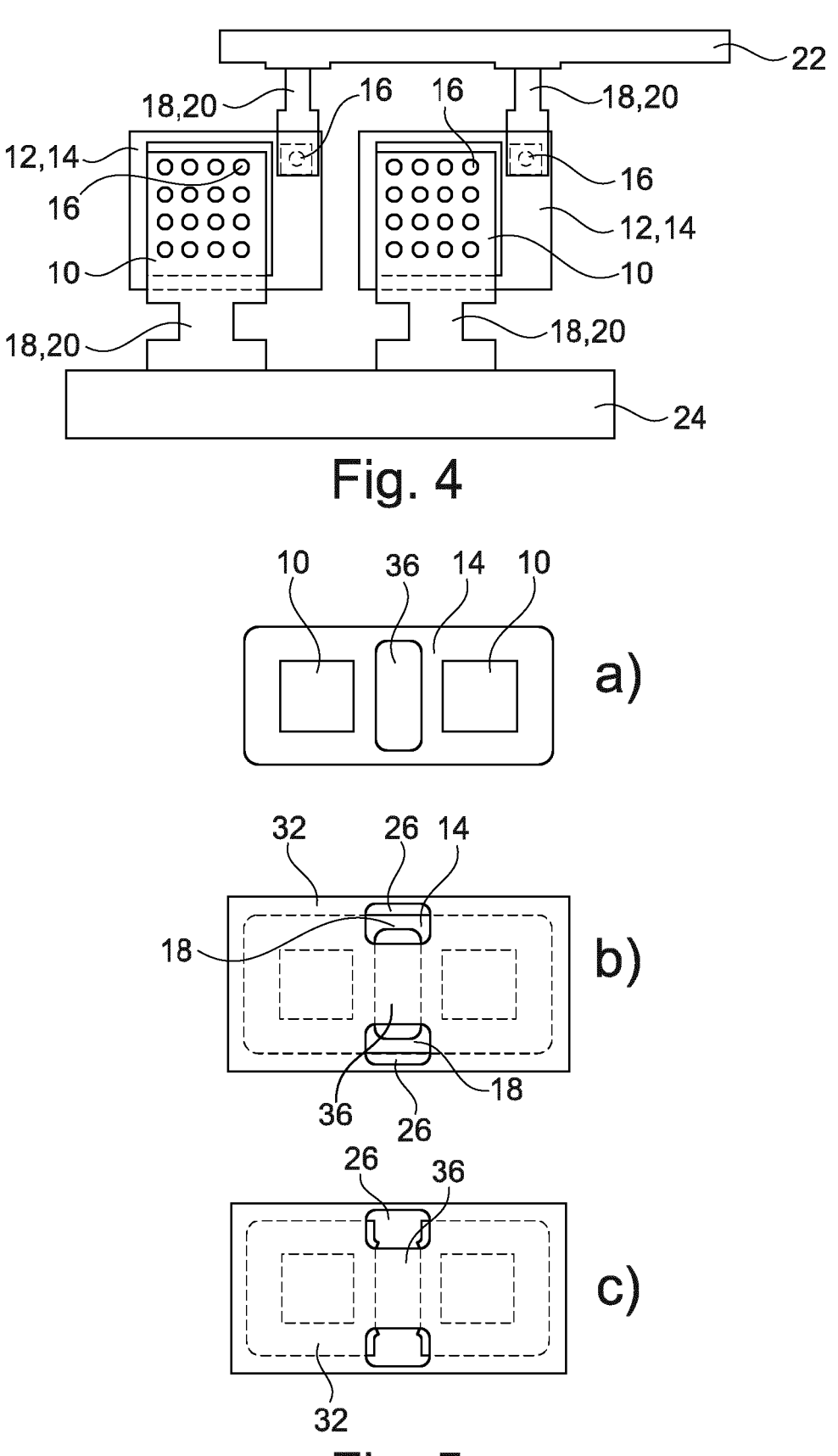
FIG. 4 shows a schematic view of a part of a power semiconductor module according to a further embodiment of the present disclosure.
FIG. 5 shows a schematic view of a part of a power semiconductor module during steps of a method for manufacturing the power semiconductor module according to a further embodiment of the disclosure.

In FIG. 4, a part of a power semiconductor module according to a further embodiment of the disclosure is shown, which allows measuring parallel interconnected power semiconductor devices 10 and which allows electrically separating damaged power semiconductor devices from non-damaged power semiconductor devices.

In FIG. 4, an embedded power module layout is shown that provides access from the top to two measuring points 18 for each power semiconductor device 10. The measuring points 18 are arranged as metallization bridges 20 that provide access for a measuring and disconnecting of each power semiconductor device 10. The metallization bridges 20 are connected to a gate bus 22 of a chip-individual gate contact or to an emitter bus 24 of a chip-individual emitter contact, respectively, and thus connect respective vias 16 of the power semiconductor devices 10 to the gate bus 22 and emitter bus 24, respectively. The gate bus 22 and the emitter bus 24 are formed of PCB metallization tracks. Further, it is shown that the power semiconductor devices 10 are positioned on leadframes 14 as substrates 12. Moreover, the power semiconductor devices 10 and the power semiconductor module may correspond in general to the ones described with reference to FIGS. 1 to 3.

The measuring points 18 may be used for sensing and disconnecting defective devices 10. Such an arrangement may be of advantage in particular in cases in that a main issue of damaged devices 10 during assembly comprise either a gate-emitter or a collector-emitter leakage, short circuit or open circuit. All these issues can be detected by this embodiment of the present disclosure, e.g., by a sensitive temperature inspection or a magnetic field/current inspection at the exposed metallization bridges 20 for each power semiconductor device 10. If a defect is detected, the respective gate and emitter vias 16 can be drilled open, the respective bridges 20 may be removed, or the defective devices 10 may be electrically separated in another way and the defective power semiconductor device 10 is efficiently separated from the non-damaged parallel power semiconductor devices 10.

An alternative solution of disconnecting chips after embedding is shown in FIG. 5 which, however, may also show the effect of the present disclosure. According to FIG. 5, the disconnection of parallel interconnected vertical power semiconductor devices 10, which are electrically connected on the bottom of each device 10, can also be achieved by cutting a leadframe 14, on which the power semiconductor devices 10 are assembled with the backside, i.e. drain or collector side, as shown in FIG. 5. Between the power semiconductor devices 10, there is an open area 36 without leadframe 14.

According to FIG. 5*a*, it is shown that two power semiconductor devices 10 are assembled on a leadframe 14 such as a leadframe 14 made from copper.

According to FIG. 5*b*, a prepreg lamination 32 of the power semiconductor devices 10 on the leadframe 14 is provided, wherein openings 26 in the lamination 32 at connecting bridges, which serve as measuring points 18 between different leadframe areas with parallel power semiconductor devices 10, are provided. The openings 26, which allow access to the leadframe 14, may be used to access measuring points 18, via which it may be measured whether one or more of the power semiconductor devices are damaged.

According to FIG. 5*c*, it is shown that the measuring points 18, which in this case were connecting bridges, respectively, are destroyed and removed, such as by drilling or cutting, e.g. laser cutting, or stamping. Accordingly, the back sides of the power semiconductor devices 10 are electrically disconnected from each other, wherein the topside interconnection is not shown in this Figure. According to this embodiment, the parallel power semiconductor devices 10 are electrically disconnected from each other after embedding. Respective connection areas may be left exposed after lamination or may be filled, as mentioned above.

The embodiment according to FIG. 5 only shows two power semiconductor devices 10, which are electrically disconnected from each other. However, in a power semiconductor module according to an embodiment of the disclosure, a plurality of such power semiconductor devices 10 may be present, which are interconnected with each other. According to the embodiment as shown in FIG. 5, defective power semiconductor devices may be separated from non-damaged power semiconductor devices in such power semiconductor module.

Figure 6:
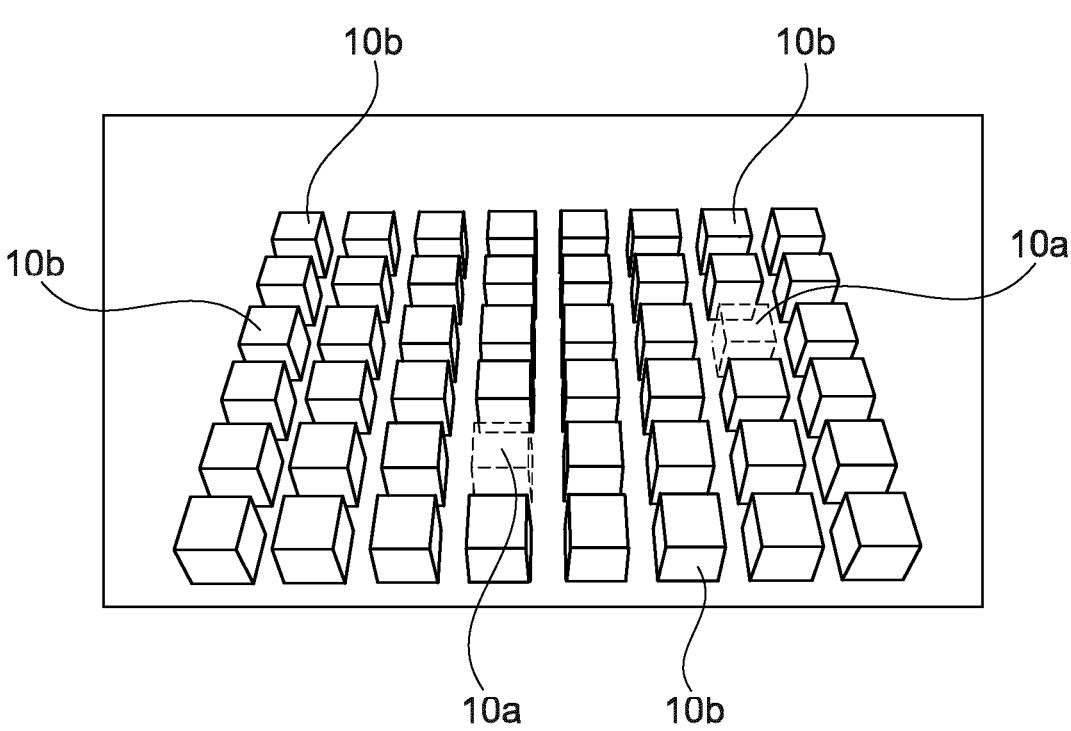
FIG. 6 shows a schematic view of a part of a power semiconductor module according to a further embodiment of the disclosure.

FIG. 6 shows a part of a power semiconductor module 34 which may be part of an electrical converter. Schematically shown is a plurality of power semiconductor devices 10, wherein the plurality of power semiconductor devices comprises a first group of power semiconductor devices which are interconnected in a parallel configuration.

Further to the first group of power semiconductor devices 10, the plurality of power semiconductor devices comprises a second group of power semiconductor devices 10, wherein all members of the second group of power semiconductor devices are electrically separated from all members of the first group of power semiconductor devices 10 such, that the first group of power semiconductor devices 10 consists of non-damaged power semiconductor devices 10*b* and that the second group of power semiconductor devices consists of damaged power semiconductor devices 10*a*.

Therefore, the first group of power semiconductor devices 10 and thus the non-damaged power semiconductor devices 10*b* may work properly without being negatively influenced by the presence of the second group of power semiconductor devices 10*a*.

While the disclosure has been illustrated and described in detail in the drawings and foregoing description, such illustration and description are to be considered illustrative or exemplary and not restrictive; the disclosure is not limited to the disclosed embodiments. Other variations to the disclosed embodiments can be understood and effected by those skilled in the art in practicing the claimed disclosure, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

REFERENCE SIGNS LIST

10 power semiconductor device
12 substrate
14 leadframe
16 via
17 copper layer
18 measuring point
19 layer
20 metallization bridge
22 gate bus
24 emitter bus
26 opening
28 drill
30 via hole
32 lamination
34 power semiconductor module
36 open area

The invention claimed is:

1. A power semiconductor module, comprising a substrate which carries a plurality of power semiconductor devices, wherein the plurality of power semiconductor devices comprises a first group of power semiconductor devices and a second group of at least one power semiconductor device, wherein the first group of power semiconductor devices comprises non-damaged power semiconductor devices and at least one power semiconductor device which is provided with a measuring arrangement, wherein the measuring arrangement comprises at least one measuring point for measuring at least one of electronic, magnetic and temperature properties of the at least one power semiconductor device, the at least one measuring point being formed by a pre-determined breaking point corresponding to a position of an electrical interconnection structure having a reduced thickness and/or width, and wherein the second group of power semiconductor devices comprises at least one damaged power semiconductor device, wherein at least two non-damaged power semiconductor devices are electrically interconnected in a parallel configuration, and wherein the second group of at least one power semiconductor device is electrically separated from members of the first group of power semiconductor devices, wherein at least one electrical connection between the at least one damaged power semiconductor device and the non-damaged power semiconductor devices is present.

2. The power semiconductor module according to claim 1, wherein electrical connections from a non-damaged power semiconductor device to an emitter and a gate of the at least one damaged power semiconductor device are interrupted, but an electrical connection from a non-damaged power semiconductor device to another contact of the at least one damaged power semiconductor device is present.

3. The power semiconductor module according to claim 1, wherein the second group of at least one power semiconductor device is electrically separated from the members of the first group of power semiconductor devices such that the at least one damaged power semiconductor device is left out of a commutation loop or a commutation cell, respectively, of the power semiconductor module.

4. The power semiconductor module according to claim 1, wherein the power semiconductor devices are wide bandgap semiconductor power devices, in particular insulated-gate bipolar transistors, IGBTs, silicon carbide metal-oxide-semiconductor field-effect transistors, SiC MOSFETs, or gallium nitride high-electron-mobility transistors, GAN HEMTs.

5. The power semiconductor module according to claim 1, wherein the first group of power semiconductor devices form part of a half-bridge configuration of SiC devices.

6. The power semiconductor of claim 1, wherein the power semiconductor is part of an electrical converter.

7. A method for manufacturing a power semiconductor module, wherein the power semiconductor module comprises a plurality of power semiconductor devices, said method comprising:

a) providing at least one substrate for carrying the plurality of power semiconductor devices; and b) placing the plurality of power semiconductor devices on the at least one substrate;

wherein, the method further comprises manufacturing steps as follows:

c) determining, if one or more power semiconductor devices of the plurality of power semiconductor devices are damaged;

d) electrically interconnecting at least a part of the power semiconductor devices comprising at least two power semiconductor devices in a parallel configuration;

wherein, after realizing the steps e) and d) and in case of at least one power semiconductor device interconnected in a parallel configuration being a damaged power semiconductor device, electrically separating the at least one damaged power semiconductor device from non-damaged power semiconductor devices such that not all electrical connections between the at least one damaged power semiconductor device and the non-damaged power semiconductor devices are removed; and wherein, after realizing the steps c) and d), at least two of the electrically interconnected power semiconductor devices in the parallel configuration are non-damaged power semiconductor devices and at least one power semiconductor device which is provided with a measuring arrangement, wherein the measuring arrangement comprises at least one measuring point for measuring at least one of electronic, magnetic and temperature properties of the at least one power semiconductor device, the at least one measuring point being formed by a pre-determined breaking point corresponding to a position of an electrical interconnection structure having a reduced thickness and/or width.

8. The method according to claim 7, wherein the steps c) and d) are repetitively performed in turns multiple times, each time for at least one power semiconductor device of the plurality of power semiconductor devices, each time further comprising:

electrically interconnecting a gate contact of a first power semiconductor device, subsequently, determining whether said first power semiconductor device is damaged, and, in case of determining that the first power semiconductor device is damaged, disconnecting the first power semiconductor device.

9. The method according to claim 7, further comprising providing in step c) at least one measuring point on at least one of the power semiconductor devices for measuring at least one of an electric, magnetic or temperature parameter in order to detect at least one of a gate-emitter leakage, a collector-emitter leakage, a short circuit or an open circuit in the damaged power semiconductor devices during assembly.

* * * * *